(12) United States Patent
Park et al.

(10) Patent No.: US 9,971,243 B2
(45) Date of Patent: May 15, 2018

(54) POLYMER, ORGANIC LAYER COMPOSITION, ORGANIC LAYER, AND METHOD OF FORMING PATTERNS

(71) Applicant: SAMSUNG SDI CO., LTD., Yongin-si, Gyeonggi-do (KR)

(72) Inventors: Yu-Shin Park, Suwon-si (KR); Tae-Ho Kim, Suwon-si (KR); Yoo-Jeong Choi, Suwon-si (KR); Sun-Hae Kang, Suwon-si (KR); Hyo-Young Kwon, Suwon-si (KR); Sang-Kyun Kim, Suwon-si (KR); Young-Min Kim, Suwon-si (KR); Youn-Hee Nam, Suwon-si (KR); Hyun-Ji Song, Suwon-si (KR); Byeri Yoon, Suwon-si (KR); Dong-Geun Lee, Suwon-si (KR); Seulgi Jeong, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 0 days. days.

(21) Appl. No.: 15/172,351

(22) Filed: Jun. 3, 2016

(65) Prior Publication Data
US 2016/0363864 A1    Dec. 15, 2016

(30) Foreign Application Priority Data

Jun. 10, 2015 (KR) .................. 10-2015-0081961
Mar. 30, 2016 (KR) .................. 10-2016-0038560

(51) Int. Cl.
  *G03F 7/11*   (2006.01)
  *G03F 7/09*   (2006.01)
  (Continued)

(52) U.S. Cl.
  CPC ............. *G03F 7/091* (2013.01); *C08G 10/00* (2013.01); *C08G 12/00* (2013.01); *C08G 16/00* (2013.01);
  (Continued)

(58) Field of Classification Search
  USPC ............................................ 216/47; 438/703
  See application file for complete search history.

(56) References Cited

U.S. PATENT DOCUMENTS

2012/0077345 A1*  3/2012  Saito .................. C08G 12/26
                                                          438/703
2014/0235060 A1*  8/2014  Shinjo ................. G03F 7/11
                                                          438/703

FOREIGN PATENT DOCUMENTS

CN      102803324 A      11/2012
CN      103635858 A       3/2014
(Continued)

OTHER PUBLICATIONS

Charton Julie, Chemical & Pharmaceutical Bulletin, vol. 53(5), May 31, 2005, p. 492-497.
(Continued)

*Primary Examiner* — Mark Kaucher
*Assistant Examiner* — Henry Hu
(74) *Attorney, Agent, or Firm* — Lee & Morse, P.C.

(57) ABSTRACT

A polymer includes a structural unit represented by Chemical Formula 1 and an organic layer composition including the same.

[Chemical Formula 1]
$$*\!-\!\!\left[\!A\!-\!B\!\right]\!-\!\!*$$

wherein in Chemical Formula 1, A is a carbon cyclic group including at least one hetero atom, B is one of groups in Group 1, where $Ar^1$ to $Ar^4$, $R^{11}$ to $R^{14}$, L and m are as defined in the specification and * is a linking point. When the carbon cyclic group includes at least two hetero atoms when the carbon cyclic group includes a pentagon cyclic moiety and the pentagon cyclic moiety includes a nitrogen atom (N) as a hetero atom, and the at least two hetero atoms are the same or different:

(Continued)

[Calculation Equation 2]

$$\text{Planarization} = \left(1 - \frac{h_2}{h_1}\right) \times 100$$

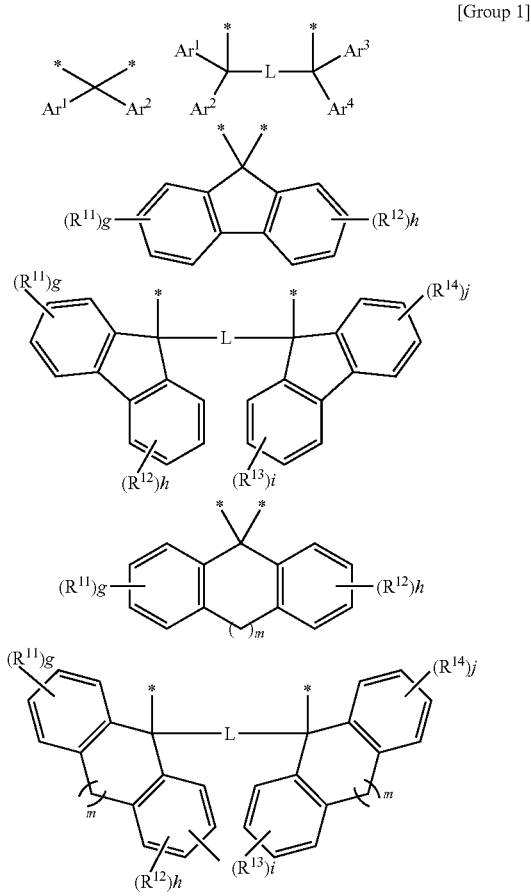

15 Claims, 1 Drawing Sheet

(51) Int. Cl.
C08G 61/12 (2006.01)
G03F 7/075 (2006.01)
C08G 10/00 (2006.01)
C08G 12/00 (2006.01)
C08G 16/00 (2006.01)
C09D 161/00 (2006.01)
C09D 161/18 (2006.01)
C09D 161/20 (2006.01)
C09D 165/00 (2006.01)

(52) U.S. Cl.
CPC ......... *C08G 61/122* (2013.01); *C08G 61/124* (2013.01); *C08G 61/125* (2013.01); *C08G 61/126* (2013.01); *C09D 161/00* (2013.01); *C09D 161/18* (2013.01); *C09D 161/20* (2013.01); *G03F 7/0752* (2013.01); *G03F 7/094* (2013.01); *C08G 2261/12* (2013.01); *C08G 2261/3142* (2013.01); *C08G 2261/3241* (2013.01); *C08G 2261/3243* (2013.01); *C08G 2261/3245* (2013.01); *C08G 2261/3246* (2013.01); *C08G 2261/344* (2013.01); *C08G 2261/3424* (2013.01); *C09D 165/00* (2013.01)

(56) References Cited

FOREIGN PATENT DOCUMENTS

| | | | |
|---|---|---|---|
| CN | 104067175 A | | 9/2014 |
| EP | 2444431 A1 | * | 4/2012 |
| JP | 4355943 B2 | | 11/2009 |
| JP | 5365809 B2 | | 12/2013 |
| JP | 5621982 B2 | | 11/2014 |
| JP | 5641253 B2 | * | 12/2014 |
| KR | 10-2012-0038447 A | * | 4/2012 |
| KR | 10-2013-0048307 A | | 5/2013 |
| KR | 10-1333703 B1 | | 11/2013 |
| KR | 10-2014-0144207 A | | 12/2014 |
| WO | WO2013/005797 A1 | | 1/2013 |
| WO | WO-2013-100409 A | * | 7/2013 |
| WO | WO 2013-100409 A | | 7/2013 |

OTHER PUBLICATIONS

Otto, P. Ph. H. L, Recueil des Travaux Chimiques des Pays-Bas et de la Belgique, vol. 77, Sep. 30, 1958, p. 345-353.
Office Action dated Feb. 8, 2017, of the corresponding Taiwanese Patent Application No. 105117785.
Chinese Office Action dated Nov. 1, 2017, of the corresponding Chinese Patent Application No. 201610393116.5.

* cited by examiner

[Calculation Equation 2]
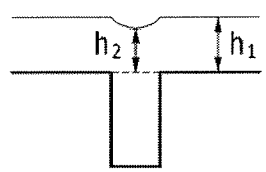 Planarization $= \left(1 - \dfrac{h_2}{h_1}\right) \times 100$

POLYMER, ORGANIC LAYER COMPOSITION, ORGANIC LAYER, AND METHOD OF FORMING PATTERNS

CROSS-REFERENCE TO RELATED APPLICATION

Korean Patent Applications No. 10-2015-0081961, filed on Jun. 10, 2015, and No. 10-2016-0038560, filed on Mar. 30, 2016, in the Korean Intellectual Property Office, and entitled: "Polymer, Organic Layer Composition, Organic Layer, and Method of Forming Patterns," is incorporated by reference herein in its entirety.

BACKGROUND

1. Field

Embodiments relate to a polymer, an organic layer composition including the polymer, and a method of forming patterns using the organic layer composition.

2. Description of the Related Art

Recently, a high integration design in accordance with down-sizing (miniaturization) and complexity of an electronic device has accelerated the development of a more advanced materials and related processes. For lithography using a general photoresist, new patterning materials and techniques are desirable.

SUMMARY

Embodiments are directed to a polymer comprising a structural unit represented by Chemical Formula 1:

[Chemical Formula 1]

wherein, in Chemical Formula 1, A is a carbon cyclic group including at least one hetero atom, B is one of groups in Group 1, and * is a linking point, wherein the carbon cyclic group includes at least two hetero atoms when the carbon cyclic group includes a pentagon cyclic moiety and the pentagon cyclic moiety includes a nitrogen atom (N) as a hetero atom, and wherein the at least two hetero atoms are the same or different:

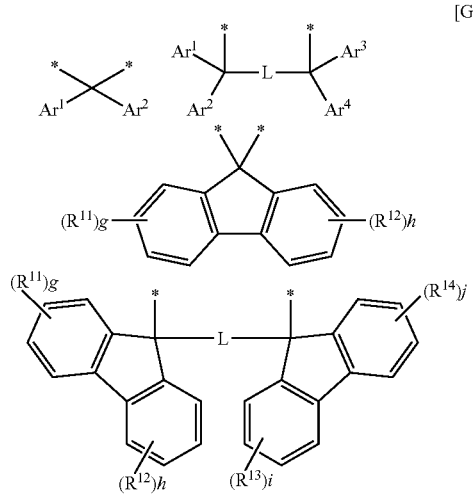

[Group 1]

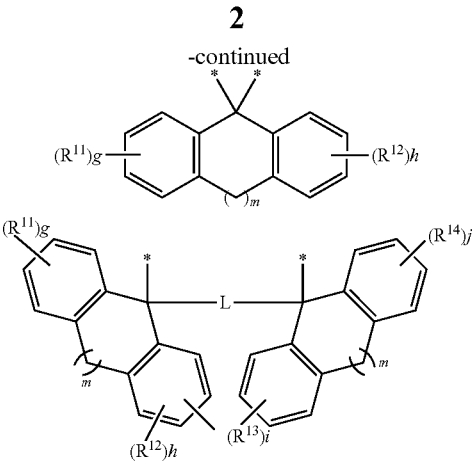

wherein, in Group 1, $Ar^1$ to $Ar^4$ are each independently a substituted or unsubstituted C6 to C30 aryl group, $R^{11}$ to $R^{14}$ are each independently, a hydroxy group, a thionyl group, a thiol group, a cyano group, a substituted or unsubstituted amino group, a halogen atom, a substituted or unsubstituted C1 to C30 alkyl group, a substituted or unsubstituted C6 to C30 aryl group, a substituted or unsubstituted C1 to C30 alkoxy group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkylether group, a substituted or unsubstituted C7 to C20 arylalkylene ether group, a substituted or unsubstituted C1 to C30 haloalkyl group, or a combination thereof, g to j are each independently an integer ranging from 0 to 2, L is a single bond, a substituted or unsubstituted C1 to C6 alkylene group, a substituted or unsubstituted C6 to C30 arylene group, or a combination thereof, m is an integer ranging from 1 to 3, and * is a linking point.

The hetero atom may be N, O, S, Te, or Se.

A may be a substituted or unsubstituted cyclic group selected from Group 2:

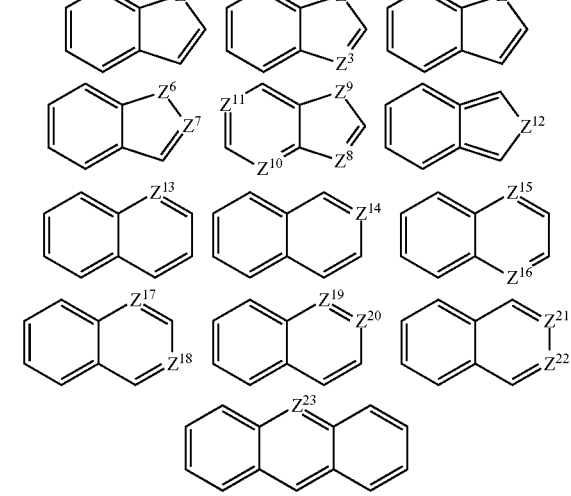

[Group 2]

In Group 2, $Z^1$ and $Z^{12}$ are O, S, Te, or Se, $Z^2$, $Z^5$, $Z^6$, and $Z^9$ are $NR^a$, O, S, Te, or Se, $Z^3$ to $Z^4$, $Z^7$ to $Z^8$, $Z^{10}$ to $Z^{11}$ and $Z^{13}$ to $Z^{23}$ are N, and $R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom or a combination thereof.

In Group 2, a location of linking points is not limited.

In Group 1, $Ar^1$ to $Ar^4$ may each independently be a substituted or unsubstituted cyclic group selected from Group 3:

[Group 3]

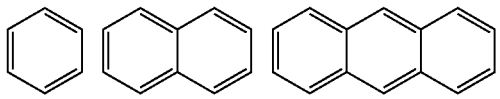

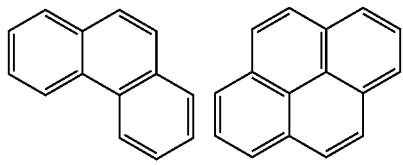

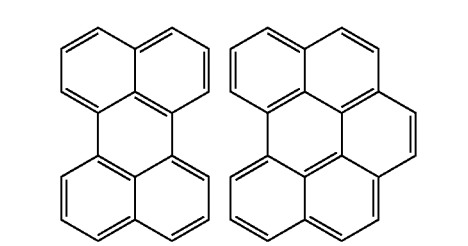

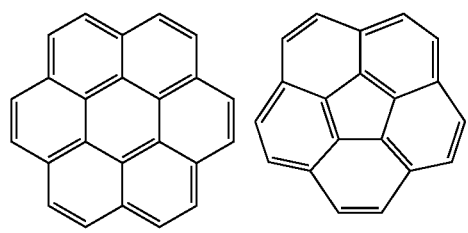

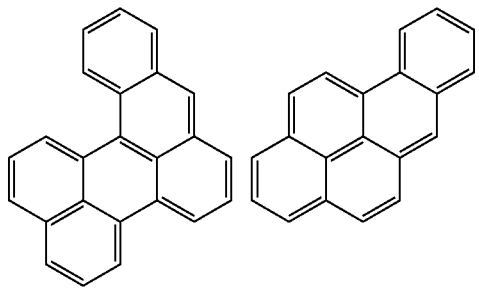

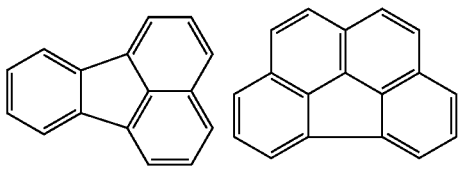

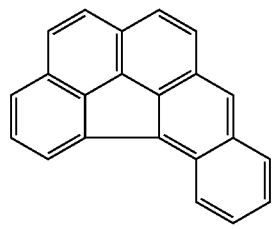

In Group 3, a location of linking points is not limited.

The structural unit represented by Chemical Formula 1 may include one of structural units represented by Chemical Formulae 1-1 to 1-8:

[Chemical Formula 1-1]

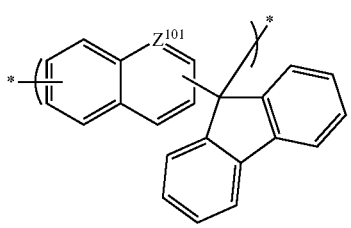

[Chemical Formula 1-2]

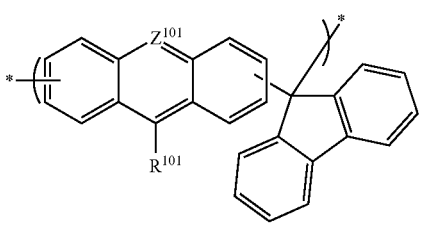

[Chemical Formula 1-3]

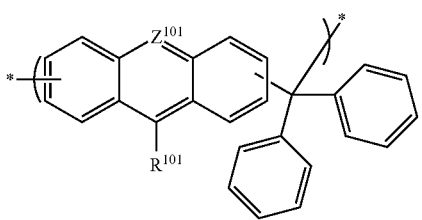

-continued

[Chemical Formula 1-4]
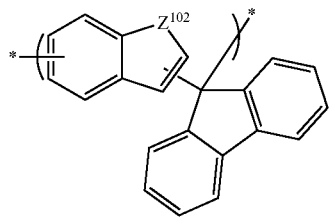

[Chemical Formula 1-5]
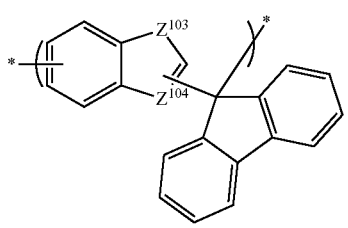

[Chemical Formula 1-6]
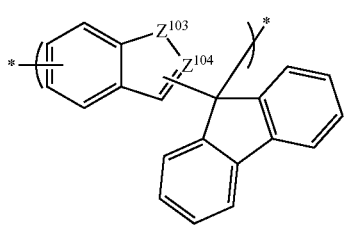

[Chemical Formula 1-7]
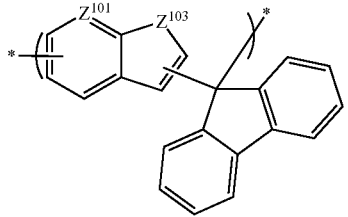

[Chemical Formula 1-8]
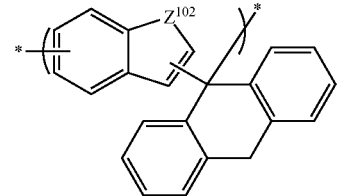

In Chemical Formulae 1-1 to 1-8, $Z^{101}$ and $Z^{104}$ are N, $Z^{102}$ is O, S, Te, or Se, $Z^{103}$ is $NR^a$, O, S, Te, or Se, $R^a$ and $R^{101}$ are hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, or a combination thereof, and * is a linking point.

The polymer may have a weight average molecular weight of about 500 to about 20,000.

Embodiments are also directed to an organic layer composition including a polymer including a structural unit represented by Chemical Formula 1 and a solvent:

[Chemical Formula 1]
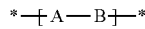

In Chemical Formula 1, A is a carbon cyclic group including at least one hetero atom, B is one of groups in Group 1, and * is a linking point. When the carbon cyclic group includes at least two hetero atoms when the carbon cyclic group includes a pentagon cyclic moiety and the pentagon cyclic moiety includes a nitrogen atom (N) as a hetero atom, and the at least two hetero atoms are the same or different.

[Group 1]
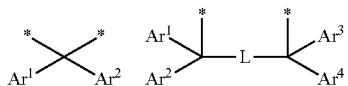

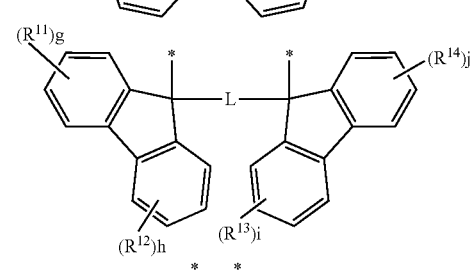

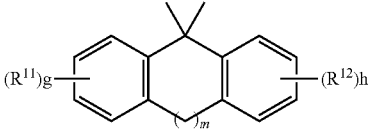

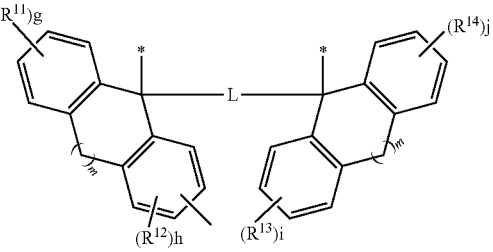

In Group 1, $Ar^1$ to $Ar^4$ are each independently a substituted or unsubstituted C6 to C30 aryl group, $R^{11}$ to $R^{14}$ are each independently a hydroxy group, a thionyl group, a thiol group, a cyano group, a substituted or unsubstituted amino group, a halogen atom, a substituted or unsubstituted C1 to C30 alkyl group, a substituted or unsubstituted C6 to C30 aryl group, a substituted or unsubstituted C1 to C30 alkoxy group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkylether group, a substituted or unsubstituted C7 to C20 arylalkylene ether group, a substituted or unsubstituted C1 to C30 haloalkyl group, or a combination thereof, g to j are each independently an integer ranging from 0 to 2, L is a single bond, a substituted or unsubstituted C1 to C6 alkylene group, a substituted or unsubstituted C6 to C30 arylene group, or a combination thereof, m is an integer ranging from 1 to 3, and * is a linking point.

The hetero atom may be N, O, S, Te, or Se.

A may be a substituted or unsubstituted cyclic group selected from Group 2:

[Group 2]

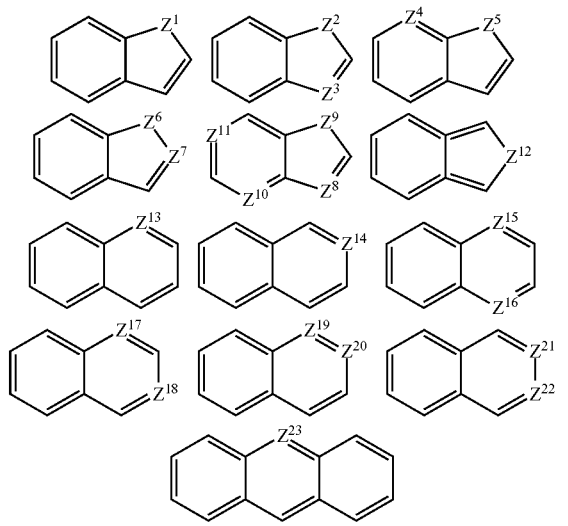

In Group 2,
$Z^1$ and $Z^{12}$ are O, S, Te, or Se,
$Z^2$, $Z^5$, $Z^6$ and $Z^9$ are $NR^a$, O, S, Te, or Se,
$Z^3$ to $Z^4$, $Z^7$ to $Z^8$, $Z^{10}$ to $Z^{11}$ and $Z^{13}$ to $Z^{23}$ is N, and
$R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom or a combination thereof. In Group 2, a location of linking points is not limited.

In Group 1, $Ar^1$ to $Ar^4$ may each independently be a substituted or unsubstituted cyclic group selected from Group 3:

[Group 3]

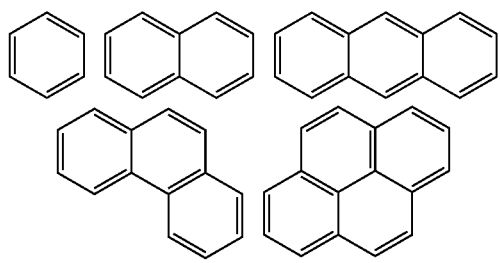

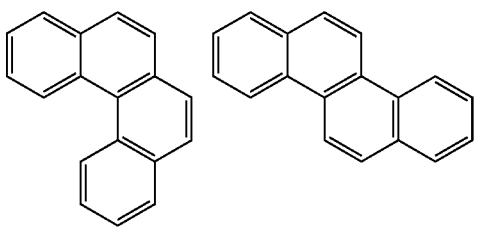

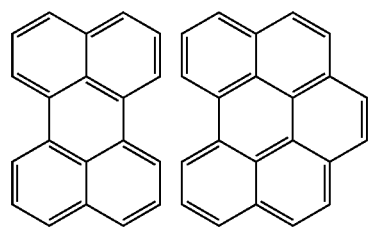

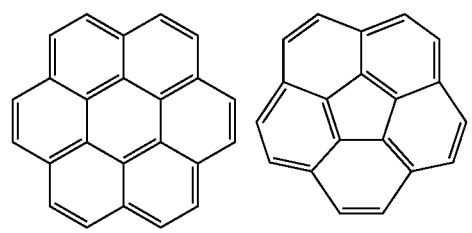

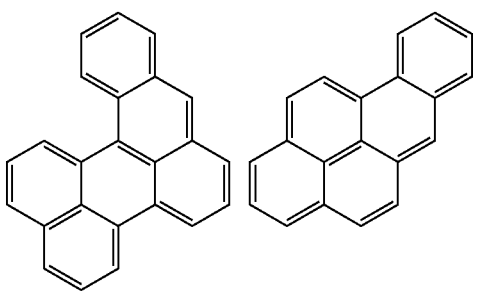

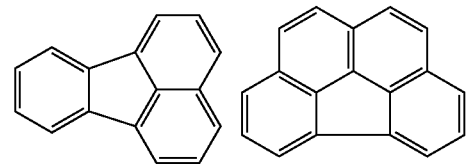

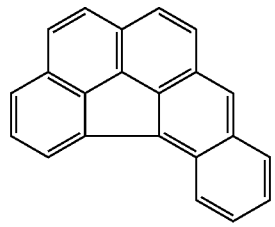

In Group 3, a location of linking points is not limited.

The structural unit represented by Chemical Formula 1 may include one of structural units represented by Chemical Formulae 1-1 to 1-8:

[Chemical Formula 1-1]

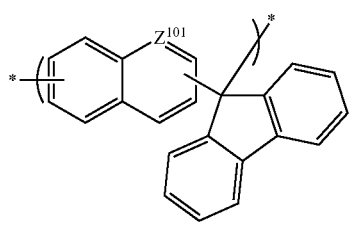

[Chemical Formula 1-2]

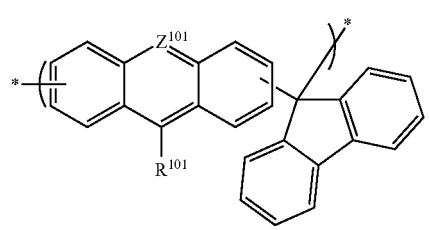

[Chemical Formula 1-3]

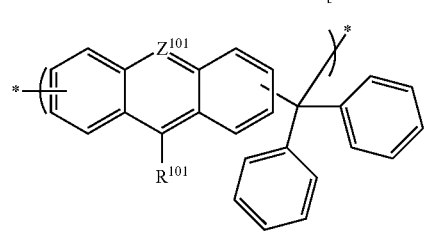

[Chemical Formula 1-4]

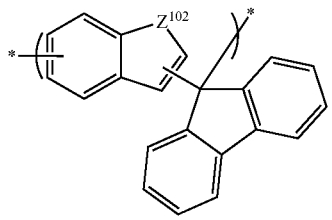

[Chemical Formula 1-5]

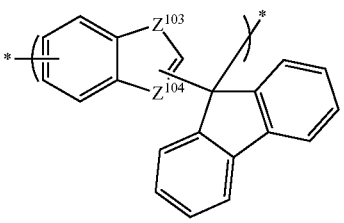

[Chemical Formula 1-6]

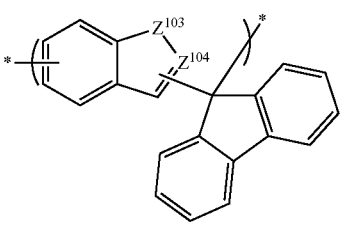

[Chemical Formula 1-7]

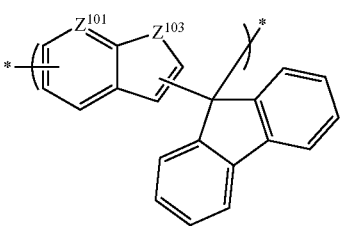

[Chemical Formula 1-8]

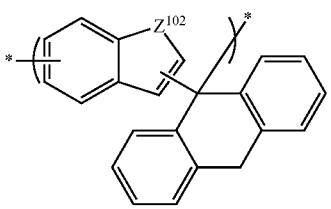

In Chemical Formulae 1-1 to 1-8,
$Z^{101}$ and $Z^{104}$ are N,
$Z^{102}$ is O, S, Te, or Se,
$Z^{103}$ is $NR^a$, O, S, Te, or Se,
$R^a$ and $R^{101}$ are hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, or a combination thereof, and
* is a linking point.

The polymer may have a weight average molecular weight of about 500 to about 20,000.

The polymer may be included in an amount of about 0.1 wt % to about 50 wt % based on the total amount of the organic layer composition.

Embodiments are also directed to an organic layer obtained by curing the organic layer composition as claimed in claim 7.

The organic layer may be a hard mask layer.

Embodiments are also directed to a method of forming patterns including providing a material layer on a substrate, applying the organic layer composition as claimed in claim 7 on the material layer, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The organic layer composition may be applied using a spin-on coating method.

The method may further include forming a bottom anti-reflective coating (BARC) before forming the photoresist layer.

The heat-treating may be performed at about 100° C. to about 500° C.

BRIEF DESCRIPTION OF THE DRAWING

Features will become apparent to those of skill in the art by describing in detail exemplary embodiments with reference to the attached drawing in which:

FIG. 1 illustrates a view depicting Calculation Equation 2 for evaluating planarization characteristics.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof, instead of a hydrogen atom of a compound.

As used herein, when a definition is not otherwise provided, the term 'hetero' used as a prefix defining a group refers to a group including 1 to 3 heteroatoms selected from N, O, S, Se, Te and P.

Hereinafter, a polymer according to an embodiment is described.

A polymer according to an embodiment includes a structural unit represented by Chemical Formula 1.

[Chemical Formula 1]

In Chemical Formula 1,

A is a carbon cyclic group including at least one hetero atom,

B is one of groups in Group 1, and

* is a linking point, for example, a linking point linking to adjacent ones of the structural unit of Chemical Formula 1.

When the carbon cyclic group includes at least two hetero atoms when the carbon cyclic group includes a pentagon cyclic moiety and the pentagon cyclic moiety includes a nitrogen atom (N) as a hetero atom, and the at least two hetero atoms are the same or different.

[Group 1]

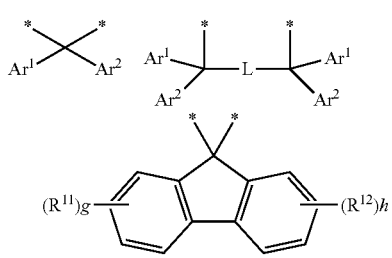

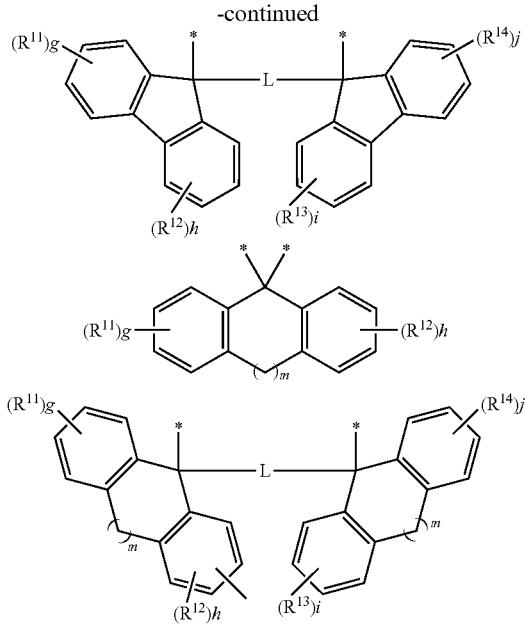

In Group 1, $Ar^1$ to $Ar^4$ are each independently a substituted or unsubstituted C6 to C30 aryl group, $R^{11}$ to $R^{14}$ are each independently a hydroxy group, a thionyl group, a thiol group, a cyano group, a substituted or unsubstituted amino group, a halogen atom, a substituted or unsubstituted C1 to C30 alkyl group, a substituted or unsubstituted C6 to C30 aryl group, a substituted or unsubstituted C1 to C30 alkoxy group, substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkylether group, a substituted or unsubstituted C7 to C20 arylalkylene ether group, a substituted or unsubstituted C1 to C30 haloalkyl group, or a combination thereof, g to j are each independently an integer ranging from 0 to 2, L is a single bond, a substituted or unsubstituted C1 to C6 alkylene group, a substituted or unsubstituted C6 to C30 arylene group, or a combination thereof, m is an integer ranging from 1 to 3, and

* is a linking point, for example, linking B to A of the structural unit of Chemical Formula 1 or linking B to an adjacent one of the structural unit of Chemical Formula 1.

The polymer may include a carbon cyclic group (A) including a hetero atom and an aromatic cyclic group (B) having a high carbon content. Accordingly, the polymer may provide rigid characteristics.

In addition, the polymer may include a tertiary carbon or a quaternary carbon in a structural unit (B in Chemical Formula 1) and thus may minimize benzylic hydrogens while maximizing a ring parameter and resultantly may further reinforce etch resistance.

In the present specification, the term "tertiary carbon" indicates a carbon atom in which three out of four hydrogens linked thereto are substituted with other groups besides hydrogen, and the term "quaternary carbon" refers to a carbon atom in which all four hydrogens linked thereto are substituted with other groups besides hydrogen.

When a polymer including tertiary carbons and/or quaternary carbons is used to prepare an organic layer composition, a spin-on coating method may be advantageously applied due to improved dissolubility. The moiety of the compound including the tertiary carbon or the quaternary carbon may be the same as one of the groups in Group 1.

In Chemical Formula 1, A is a carbon cyclic group including a hetero atom. Herein, the term "hetero atom" may refer to any atom except for carbon or hydrogen. A may include, for example, a hetero atom such as N, O, S, Te, or Se. In Chemical Formula 1, A may include, for example, 1, 2, 3, or 4 hetero atoms. When, the carbon cyclic group A includes, for example, a pentagonal cyclic moiety, and when the carbon cyclic group A includes at least two hetero atoms, at least one hetero atom of the carbon cyclic group may be a nitrogen atom (N).

For example, when a plurality of hetero atoms is included in the A, these hetero atoms may be the same or different. For example, when the carbon cyclic group A includes a pentagonal cycle, the carbon cyclic group may include, for example, two nitrogen atoms.

The polymer may include a hetero atom in a structural unit. Solubility and gap-fill characteristics of the polymer may be improved.

In Chemical Formula 1, A may include, for example at least one substituted or unsubstituted benzene ring. For example, A may be a substituted or unsubstituted cyclic group selected from Group 2.

[Group 2]

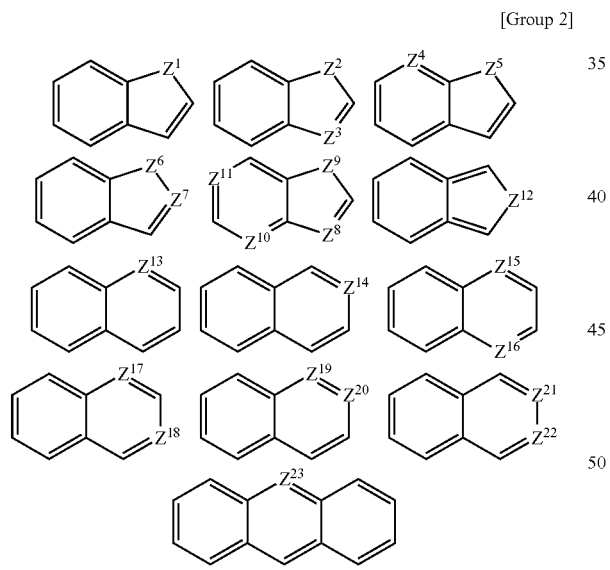

In Group 2,
$Z^1$ and $Z^{12}$ are O, S, Te, or Se,
$Z^2$, $Z^5$, $Z^6$ and $Z^9$ are $NR^a$, O, S, Te, or Se,
$Z^3$ to $Z^4$, $Z^7$ to $Z^8$, $Z^{10}$ to $Z^{11}$ and $Z^{13}$ to $Z^{23}$ is N, and
$R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom or a combination thereof.

In Group 2, it is to be understood that the substituted or unsubstituted cyclic group may include linking points to B and to an adjacent one of structural unit of Chemical Formula 1. The location of linking points is not limited.

In Chemical Formula 1, $Ar^1$ to $Ar^4$ of Group 1 may each independently be a substituted or unsubstituted cyclic group selected from Group 3, as examples.

[Group 3]

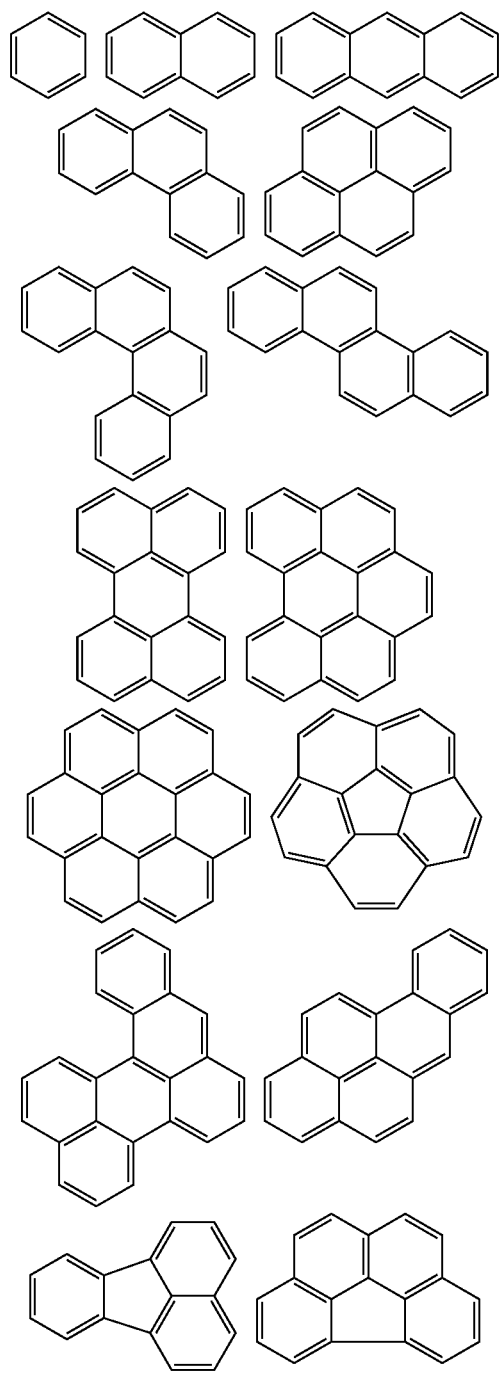

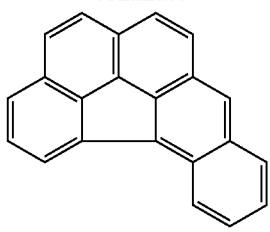

In Group 3, it is to be understood that the substituted or unsubstituted cyclic group may include a linking point to a quaternary carbon atom of Group 1. The location of the linking point is not limited.

When a compound depicted in Groups 2 and 3 is in a substituted form, one hydrogen in the compound may be substituted with a hydroxy group, a substituted or unsubstituted C1 to C30 alkyl group, a substituted or unsubstituted C1 to C30 alkoxy group, or a combination thereof.

The polymer may include one of structural units represented by Chemical Formulae 1-1 to 1-8, as examples.

[Chemical Formula 1-1]

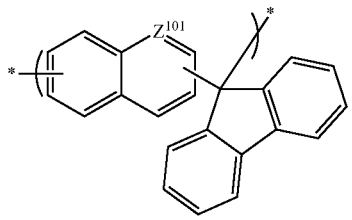

[Chemical Formula 1-2]

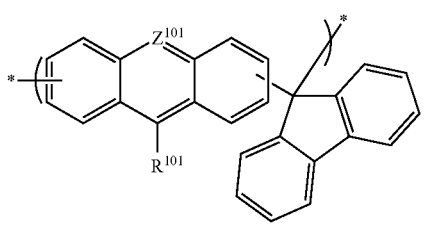

[Chemical Formula 1-3]

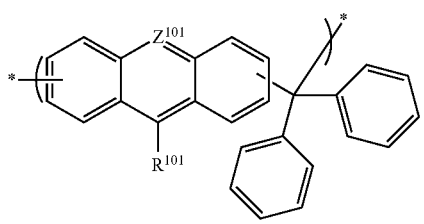

[Chemical Formula 1-4]

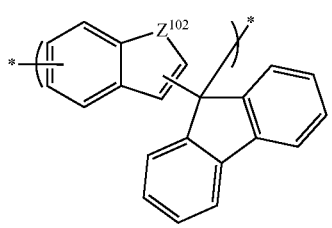

[Chemical Formula 1-5]

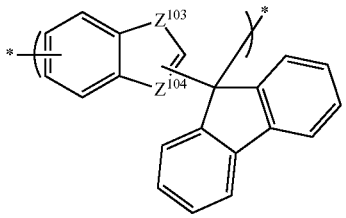

[Chemical Formula 1-6]

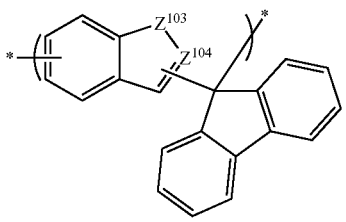

[Chemical Formula 1-7]

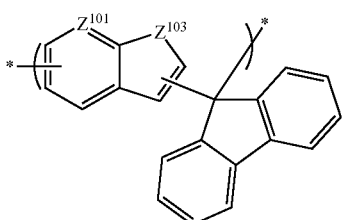

[Chemical Formula 1-8]

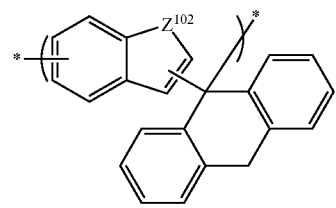

In Chemical Formulae 1-1 to 1-8, $Z^{101}$ and $Z^{104}$ are N, $Z^{102}$ is O, S, Te, or Se, $Z^{103}$ is $NR^a$, O, S, Te, or Se, $R^a$ and $R^{101}$ are hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, or a combination thereof, and

* is a linking point, for example, a linking point to an adjacent one of the structural unit of Chemical Formula 1.

The polymer may have a weight average molecular weight of about 500 to about 20,000, as an example. When the polymer has a weight average molecular weight within the range, an organic layer composition (e.g., a hard mask composition) including the polymer may be optimized by adjusting the amount of carbon and the solubility in a solvent.

When the polymer is an organic layer material, a uniform thin film may be formed without forming a pin-hole and a void or deteriorating a thickness distribution during a baking process. In addition, excellent gap-fill and planarization characteristics may be obtained when a step is present or when a pattern is formed in a lower substrate (or a layer).

According to an embodiment, an organic layer composition including the polymer and a solvent may be provided.

The solvent may be a suitable solvent having sufficient dissolubility or dispersion for the polymer. The solvent may be, for example, at least one selected from propylene glycol, propylene glycol diacetate, methoxy propanediol, diethylene glycol, diethylene glycol butylether, tri(ethylene glycol) monomethylether, propylene glycol monomethylether, propylene glycol monomethylether acetate, cyclohexanone, ethylacetate, gamma-butyrolactone, N,N-dimethyl formamide, N,N-dimethyl acetamide, methylpyrrolidone, methylpyrrolidinone, acetylacetone and ethyl 3-ethoxypropionate.

The polymer may be included in an amount of about 0.1 to about 30 wt % based on the total amount of the organic layer composition. When the polymer is included in the range, a thickness, surface roughness and planarization of the organic layer may be controlled.

The organic layer composition may further include an additive such as a surfactant, a cross-linking agent, a thermal acid generator, a plasticizer, or the like.

The surfactant may include, for example, alkylbenzene sulfonate salt, alkyl pyridinium salt, polyethylene glycol, or a quaternary ammonium salt, as examples.

The cross-linking agent may be, for example a melamine-based, a substituted urea-based, or a polymer-based agent thereof. For example, a cross-linking agent having at least two cross-linking forming substituents may be, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or buthoxymethylated thiourea, or the like.

The cross-linking agent may be a cross-linking agent having high heat resistance. The cross-linking agent having high heat resistance may be a compound containing a crosslink-forming substituent having aromatic ring (for example, a benzene ring or a naphthalene ring) in a molecule.

The thermal acid generator may be, for example, an acidic compound such as p-toluenesulfonic acid, trifluoromethanesulfonic acid, pyridinium-p-toluenesulfonic acid, salicylic acid, sulfosalicylic acid, citric acid, benzoic acid, hydroxybenzoic acid, naphthalenecarbonic acid and the like or/and 2,4,4,6-tetrabromocyclohexadienone, benzointosylate, 2-nitrobenzyltosylate, other organosulfonic acid alkylester, or the like.

The additive may be included in an amount of about 0.001 to 40 parts by weight based on 100 parts by weight of the organic layer composition. When the additive is included within the range, solubility may be improved without changing optical properties of the organic layer composition.

According to an embodiment, an organic layer manufactured using the organic layer composition may be provided. The organic layer may be formed, for example, by coating the organic layer composition on a substrate and curing the organic layer composition by heat-treating. The organic layer composition may form, for example, a hardmask layer, a planarization layer, a sacrificial layer, a filler, or the like, for an electronic device.

Hereafter, a method for forming patterns by using the organic layer composition is described.

A method of forming patterns according to an embodiment may include providing a material layer on a substrate, applying the organic layer composition including the polymer and a solvent heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, for example, a silicon wafer, a glass substrate, or a polymer substrate.

The material layer may be a material to be finally patterned, for example a metal layer such as an aluminum layer or a copper layer, a semiconductor layer such as a silicon layer, or an insulation layer such as a silicon oxide layer or a silicon nitride layer. The material layer may be formed through a method such as a chemical vapor deposition (CVD) process.

The organic layer composition may be the same as described above. The organic layer may be applied in a form of a solution by spin-on coating. A thickness of the organic layer composition may be, for example about 50 Å to about 10,000 Å.

Heat-treating the organic layer composition may be performed, for example, at about 100 to about 500° C. for about 10 seconds to 1 hour.

The silicon-containing thin layer may be formed of, for example, a material such as SiCN, SiOC, SiON, SiOCN, SiC and/or SiN or the like.

The method may further include forming a bottom anti-reflective coating (BARC) before forming the photoresist layer on the silicon-containing thin layer.

Exposure of the photoresist layer may be performed using, for example ArF, KrF, or EUV. After exposure, heat treatment may be performed at about 100° C. to about 500° C.

Etching the exposed part of the material layer may be performed through a dry etching process using an etching gas. The etching gas may be, for example $CHF_3$, $CF_4$, $Cl_2$, $BCl_3$, or a mixed gas thereof.

The etched material layer may be formed as a plurality of patterns. The plurality of patterns may be a metal pattern, a semiconductor pattern, an insulation pattern, or the like, and may be, for example, diverse patterns of a semiconductor integrated circuit device.

The following Synthesis Examples, Comparative Synthesis Examples, Examples and Comparative Examples are provided in order to highlight characteristics of one or more embodiments, but it will be understood that the Synthesis Examples, Comparative Synthesis Examples, Examples and Comparative Examples are not to be construed as limiting the scope of the embodiments, nor are the Comparative Examples to be construed as being outside the scope of the embodiments. Further, it will be understood that the embodiments are not limited to the particular details described in the Synthesis Examples, Comparative Synthesis Examples, Examples and Comparative Examples.

SYNTHESIS EXAMPLES

Synthesis Example 1

Quinoline (12.9 g, 0.1 mol), 9-fluorenone (18 g, 0.1 mol), p-toluene sulfonic acid monohydrate (9.5 g, 0.05 mol), and 1,4-dioxane (94 g) were put in a flask and then, agitated at 100° C. for 8 hours. When the reaction was complete, hexane (100 g) was added thereto to extract 1,4-dioxane, a precipitate produced by methanol thereto was filtered, and a monomer remaining there was removed by using methanol, obtaining a polymer represented by Chemical Formula 1a.

[Chemical Formula 1a]

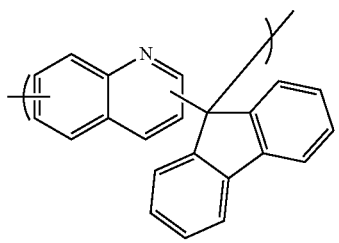

Synthesis Example 2

9-methylacridine (19.3 g, 0.1 mol), 9-fluorenone (18 g, 0.1 mol), p-toluene sulfonic acid monohydrate (9.5 g, 0.05 mol), and 1,4-dioxane (98 g) were put in a flask and then, agitated at 100° C. for 12 hours. When the reaction was complete, hexane (100 g) was added thereto to extract 1,4-dioxane, a monomer remaining after recrystallization by using acetonitrile and methanol was removed by using acetonitrile and methanol, obtaining a polymer represented by Chemical Formula 2a.

[Chemical Formula 2a]

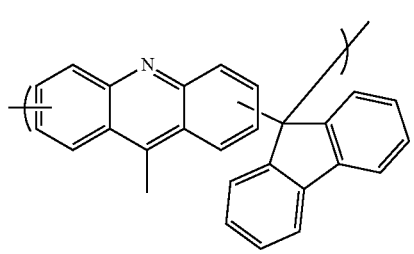

Synthesis Example 3

9-methylacridine (19.3 g, 0.1 mol), benzophenone (18.2 g, 0.1 mol), p-toluene sulfonic acid monohydrate (9.5 g, 0.05 mol), and 1,4-dioxane (98 g) were put in a flask and then, agitated at 100° C. for 12 hours. When the reaction was complete, hexane (100 g) was added thereto to extract 1,4-dioxane, and a monomer remaining after recrystallization by using acetonitrile and methanol was removed by using acetonitrile and methanol, obtaining a polymer represented by Chemical Formula 3a.

[Chemical Formula 3a]

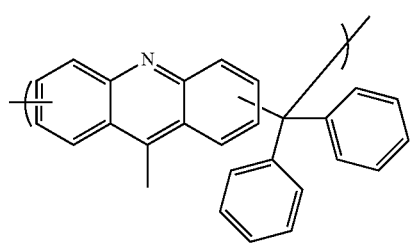

Synthesis Example 4

Thianaphthene (13.4 g, 0.1 mol), 9-fluorenone (18 g, 0.1 mol), p-toluene sulfonic acid monohydrate (9.5 g, 0.05 mol), and 1,4-dioxane (92 g) were put in a flask and then, agitated at 100° C. for 8 hours. When the reaction was complete, hexane (100 g) was added thereto to extract 1,4-dioxane, and a monomer remaining after filtering a precipitate formed by adding methanol thereto was removed, obtaining a polymer represented by Chemical Formula 4a.

[Chemical Formula 4a]

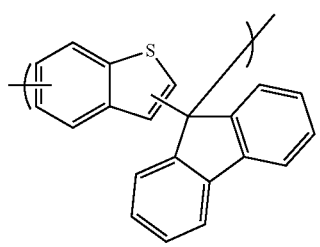

Synthesis Example 5

Benzothiazole (13.5 g, 0.1 mol), 9-fluorenone (18 g, 0.1 mol), p-toluene sulfonic acid monohydrate (9.5 g, 0.05 mol), and 1,4-dioxane (91 g) were put in a flask and then, agitated at 100° C. for 14 hours. When the reaction was complete, hexane (100 g) was added thereto to extract 1,4-dioxane, and a monomer remaining after filtering a precipitate formed by adding methanol thereto, obtaining a polymer represented by Chemical Formula 5a.

[Chemical Formula 5a]

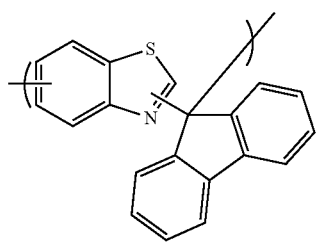

Synthesis Example 6

Benzoxazole (11.9 g, 0.1 mol), 9-fluorenone (18 g, 0.1 mol), p-toluene sulfonic acid monohydrate (9.5 g, 0.05 mol), and 1,4-dioxane (91 g) were put in a flask and then, agitated at 100° C. for 14 hours. When the reaction was complete, hexane (100 g) was added thereto to extract 1,4-dioxane, and a monomer remaining after filtering a precipitate formed by adding methanol thereto was removed by using methanol, obtaining a polymer represented by Chemical Formula 6a.

[Chemical Formula 6a]

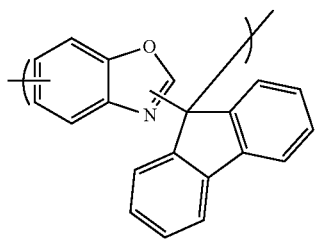

Synthesis Example 7

Indazole (11.8 g, 0.1 mol), 9-fluorenone (18 g, 0.1 mol), p-toluene sulfonic acid monohydrate (9.5 g, 0.05 mol), and 1,4-dioxane (91 g) were put in a flask and then, agitated at 100° C. for 14 hours. When the reaction was complete, hexane (100 g) was added thereto to extract 1,4-dioxane, and a monomer remaining after filtering a precipitate formed by adding methanol thereto was removed by using methanol, obtaining a polymer represented by Chemical Formula 7a.

[Chemical Formula 7a]

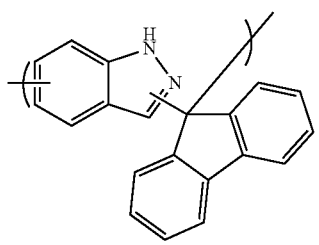

Synthesis Example 8

7-Azaindole (11.8 g, 0.1 mol), 9-fluorenone (18 g, 0.1 mol), p-toluene sulfonic acid monohydrate (9.5 g, 0.05 mol), and 1,4-dioxane (92 g) were put in a flask and agitated at 100° C. for 8 hours. When the reaction was complete, hexane (100 g) was added thereto to extract 1,4-dioxane, and a monomer remaining after filtering a precipitate formed by adding methanol thereto wad removed by using methanol, obtaining a polymer represented by Chemical Formula 8a.

[Chemical Formula 8a]

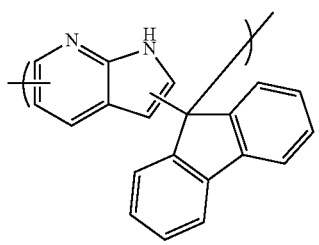

Synthesis Example 9

Thianaphthene (20.1 g, 0.15 mol), anthrone (17.5 g, 0.09 mol), p-toluene sulfonic acid monohydrate (9.5 g, 0.05 mol), and 1,4-dioxane (152 g) were put in a flask and then, agitated at 100° C. for 8 hours. When the reaction was complete, hexane (100 g) was added thereto to extract 1,4-dioxane, and a monomer remaining after filtering a precipitate formed by adding methanol thereto was removed by using methanol, obtaining a polymer represented by Chemical Formula 9a.

[Chemical Formula 9a]

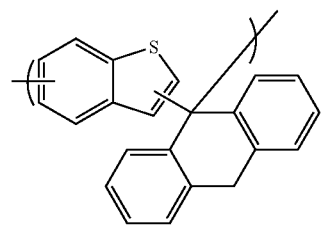

Comparative Synthesis Example 1

9,9'-bis(4-hydroxyphenyl)fluorene (50.0 g, 0.143 mol), 1,4-bis(methoxymethyl)benzene (23.7 g, 0.143 mol), and propylene glycol monomethylether acetate (50 g) were put in a flask, preparing a solution. Then, diethyl sulfate (1.10 g, 7.13 mmol) was added to the solution, and the mixture was agitated at 100° C. for 24 hours. When the polymerization was complete, the resultant was precipitated in methanol to remove a monomer and a low molecular weight, obtaining a polymer represented by Chemical Formula 10a.

[Chemical Formula 10a]

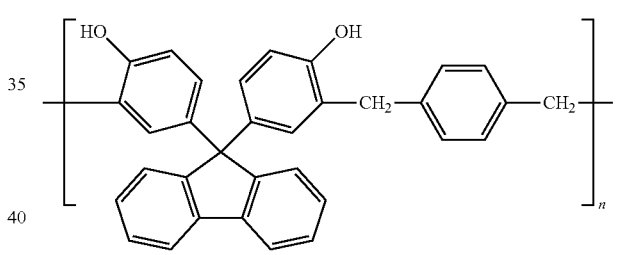

Preparation of Hardmask Composition

Example 1

The polymer according to Synthesis Example 1 was dissolved in a mixed solvent of propylene glycol monomethylether acetate (PGMEA) and cyclohexanone (7:3 (v/v)), and the solution was filtered, preparing a hardmask composition. The weight of the polymer was adjusted in a range of 5.0 wt % to 15.0 wt % based on the total weight of the hardmask composition depending on a desired thickness.

Example 2

A hardmask composition was prepared according to the same method as Example 1 except for using the polymer of Synthesis Example 2 instead of the polymer of Synthesis Example 1.

Example 3

A hardmask composition was prepared according to the same method as Example 1 except for using the polymer of Synthesis Example 3 instead of the polymer of Synthesis Example 1.

Example 4

A hardmask composition was prepared according to the same method as Example 1 except for using the polymer of Synthesis Example 4 instead of the polymer of Synthesis Example 1.

Example 5

A hardmask composition was prepared according to the same method as Example 1 except for using the polymer of Synthesis Example 5 instead of the polymer of Synthesis Example 1.

Example 6

A hardmask composition was prepared according to the same method as Example 1 except for using the polymer of Synthesis Example 6 instead of the polymer of Synthesis Example 1.

Example 7

A hardmask composition was prepared according to the same method as Example 1 except for using the polymer of Synthesis Example 7 instead of the polymer of Synthesis Example 1.

Example 8

A hardmask composition was prepared according to the same method as Example 1 except for using the polymer of Synthesis Example 8 instead of the polymer of Synthesis Example 1.

Example 9

A hardmask composition was prepared according to the same method as Example 1 except for using the polymer of Synthesis Example 9 instead of the polymer of Synthesis Example 1.

Comparative Example 1

A hardmask composition was prepared according to the same method as Example 1 except for using the polymer of Comparative Synthesis Example 1 instead of the polymer of Synthesis Example 1.

Evaluation 1: Etch Resistance

Each hardmask composition (the content of a polymer: 9.5%) according to Examples 1 to 9 and Comparative Example 1 was spin-on coated onto a patterned silicon wafer. Subsequently, the coated wafer was heat-treated at 400° C. for 120 seconds to form a thin film, and the thickness of the thin film was measured by using a ST5000 thin film thickness meter made by K-MAC.

Subsequently, the thin film was dry etched by using a $N_2/O_2$ mixed gas (50 mT/300 W/10$O_2$/50$N_2$) for 60 seconds, and the thickness of the thin film was measured again. Then, a bulk etch rate, (BER) was calculated according to Calculation Equation 1 by using the thicknesses of the thin film before and after the dry etching and etching time.

Additionally, CFx gas (100 mT/600 W/42$CF_4$/600Ar/15$O_2$) instead of the $N_2/O_2$ mixed gas was used to dry etch the thin film for 120 seconds, and an etch rate was calculated according to Calculation Equation 1.

Bulk etch rate(BER)=(Initial thickness of thin film−Thickness of thin film after etching)/etching time (Å/s)    [Calculation Equation 1]

The results are provided in Table 1.

TABLE 1

|  | Bulk etch rate (Å/s) | |
| --- | --- | --- |
|  | $N_2/O_2$ etch | CFx etch |
| Example 1 | 23.6 | 25.1 |
| Example 2 | 23.5 | 25.3 |
| Example 3 | 23.2 | 25.3 |
| Example 4 | 23.6 | 25.4 |
| Example 5 | 23.5 | 25.2 |
| Example 6 | 23.4 | 25.4 |
| Example 7 | 23.7 | 25.5 |
| Example 8 | 23.3 | 25.4 |
| Example 9 | 23.7 | 25.7 |
| Comparative Example 1 | 28.4 | 30.2 |

Referring to Table 1, each thin film respectively formed of the hardmask compositions according to Examples 1 to 9 showed a low etch rate with respect to the $N_2/O_2$ mixed gas and the CFx gas compared with the thin film formed of the hardmask composition according to Comparative Example 1.

Accordingly, the hardmask compositions according to Examples 1 to 9 showed high etch resistance compared with the thin film formed of the hardmask composition according to Comparative Example 1.

Evaluation 2: Planarization Characteristics

Each hardmask composition (the content of a polymer: 5%) according to Examples 1 to 9 and Comparative Example 1 was spin-on coated onto a patterned silicon wafer and then heat-treated at 400° C. for 120 seconds. Planarization characteristics of the thin film were examined.

The planarization characteristics were digitized according Calculation Equation 2 shown in FIG. 1 by measuring the thickness of a hardmask layer from the cross-section image of a pattern observed by SEM. Accordingly to Calculation Equation 2, the planarization characteristics are considered to be more excellent as a difference between h1 and h2 becomes smaller.

The results are provided in Table 2.

TABLE 2

|  | Planarization characteristics |
| --- | --- |
| Example 1 | 9.8 |
| Example 2 | 10.2 |
| Example 3 | 10.6 |
| Example 4 | 9.9 |
| Example 5 | 10.2 |
| Example 6 | 9.8 |
| Example 7 | 9.7 |
| Example 8 | 10.1 |
| Example 9 | 10.4 |
| Comparative Example 1 | 13.2 |

Referring to Table 2, each thin film respectively formed of the hardmask compositions according to Examples 1 to 9 showed a low planarization characteristic measurement according to Calculation Equation 2 and thus excellent planarization characteristics compared with the thin film formed of the hardmask composition according to Comparative Example 1.

Evaluation 3: Heat Resistance

Each hardmask composition (10.0 wt %) according to Examples 1 to 9 and Comparative Example 1 was spincoated onto a silicon wafer and then, heat-treated at 240° C. for 1 minute to form a thin film. The thickness of the thin film was measured by using a thin film thickness meter made by K-MAC. The thin film was heat-treated again at 400° C. for 2 minutes, and the thickness of the thin film was measured again. The thicknesses of the thin film at two temperatures were used to calculate a thickness decrease ratio of the thin film according to Calculation Equation 3 and thus digitize relative heat resistance of the hardmask film.

The results are provided in Table 3.

Thickness decrease ratio of thin film=(thickness of thin film baked at 240° C.−thickness of thin film baked at 400° C.)/(thickness of thin film baked at 240° C.)×100(%)   [Calculation Equation 3]

TABLE 3

|  | Thickness decrease ratio (%) of thin film |
|---|---|
| Example 1 | 15.7 |
| Example 2 | 12.3 |
| Example 3 | 12.1 |
| Example 4 | 18.7 |
| Example 5 | 17.5 |
| Example 6 | 17.2 |
| Example 7 | 15.9 |
| Example 8 | 16.5 |
| Example 9 | 16.9 |
| Comparative Example 1 | 32 |

Referring to Table 3, each thin film respectively formed of the hardmask compositions according to Examples 1 to 9 showed a small thickness decrease rate during a heat treatment at 400° C. compared with a thin film formed of the hardmask composition according to Comparative Example 1.

Accordingly, the hardmask compositions according to Examples 1 to 9 were highly cross-linked and showed high heat resistance at 400° C. compared with the hardmask composition according to Comparative Example 1.

By way of summation and review, in a patterning process, an organic layer referred to as a hardmask layer may be formed as a hard interlayer to transfer a fine pattern of a photoresist down to a sufficient depth on a substrate without collapse. The hardmask layer plays a role of an intermediate layer for transferring the fine pattern of photoresist to a material layer through a selective etching process. Accordingly, it is desirable for the hardmask layer have characteristics such as etch resistance, and the like, to be tolerated during the multiple etching processes. It has been suggested to form a hardmask layer by a spin-on coating method instead of by chemical vapor deposition. In general, heat resistance and etch resistance have a trade-off relationship with spin-on characteristics. An organic layer material that satisfies the characteristics of a hardmask layer and that may be formed by a spin-on coating method is desirable.

Embodiments provide a polymer that has improved etch resistance and simultaneously has good solubility characteristics. A polymer having excellent etch resistance and heat resistance and simultaneously having satisfactory solubility characteristics and thus being applicable in a spin-on coating method is provided. Embodiments also provide an organic layer composition including the polymer. Embodiments also provide an organic layer that simultaneously satisfies desired mechanical characteristics and desired film flatness. Embodiment also provide a method of forming patterns using the organic layer composition.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A polymer comprising a structural unit represented by Chemical Formula 1:

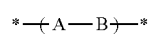

[Chemical Formula 1]

wherein, in Chemical Formula 1,
A is a substituted or unsubstituted cyclic group selected from Group 2:

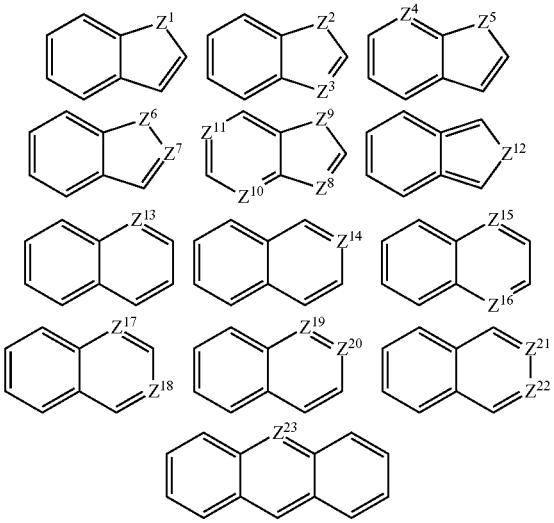

[Group 2]

wherein, in Group 2,
$Z^1$ and $Z^{12}$ are O, S, Te, or Se,
$Z^2$, $Z^5$, $Z^6$, and $Z^9$ are $NR^a$, O, S, Te, or Se,
$Z^3$ to $Z^4$, $Z^7$ to $Z^8$, $Z^{10}$ to $Z^{11}$ and $Z^{13}$ to $Z^{23}$ are N, and
$R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom or a combination thereof, wherein in Group 2, a location of linking points is not limited,
B is one of groups in Group 1, and
* is a linking point,

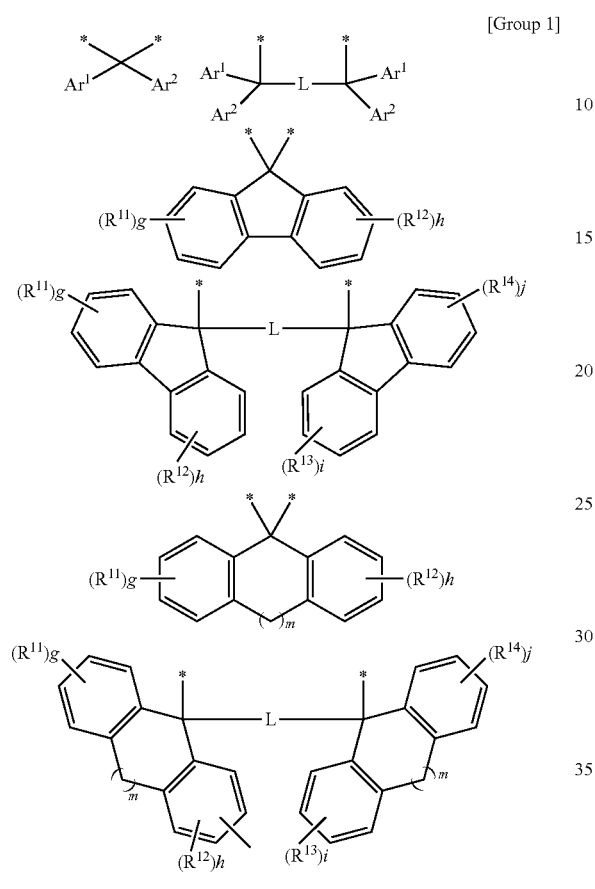

wherein, in the Group 1,
Ar$^1$ to Ar$^4$ are each independently a substituted or unsubstituted C6 to C30 aryl group,
R$^{11}$ to R$^{14}$ are each independently a hydroxy group, a thionyl group, a thiol group, a cyano group, a substituted or unsubstituted amino group, a halogen atom, a substituted or unsubstituted C1 to C30 alkyl group, a substituted or unsubstituted C6 to C30 aryl group, a substituted or unsubstituted C1 to C30 alkoxy group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkylether group, a substituted or unsubstituted C7 to C20 arylalkylene ether group, a substituted or unsubstituted C1 to C30 haloalkyl group, or a combination thereof,
g to j are each independently an integer ranging from 0 to 2,
L is a single bond, a substituted or unsubstituted C1 to C6 alkylene group, a substituted or unsubstituted C6 to C30 arylene group, or a combination thereof,
m is an integer ranging from 1 to 3, and
* is a linking point.

2. The polymer as claimed in claim 1, wherein the hetero atom is N, O, S, Te, or Se.

3. The polymer as claimed in claim 1, wherein:
B in Chemical Formula 1 is selected from

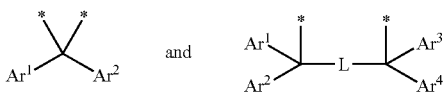

in Group 1, and
Ar$^1$ to Ar$^4$ are each independently a substituted or unsubstituted cyclic group selected from Group 3:

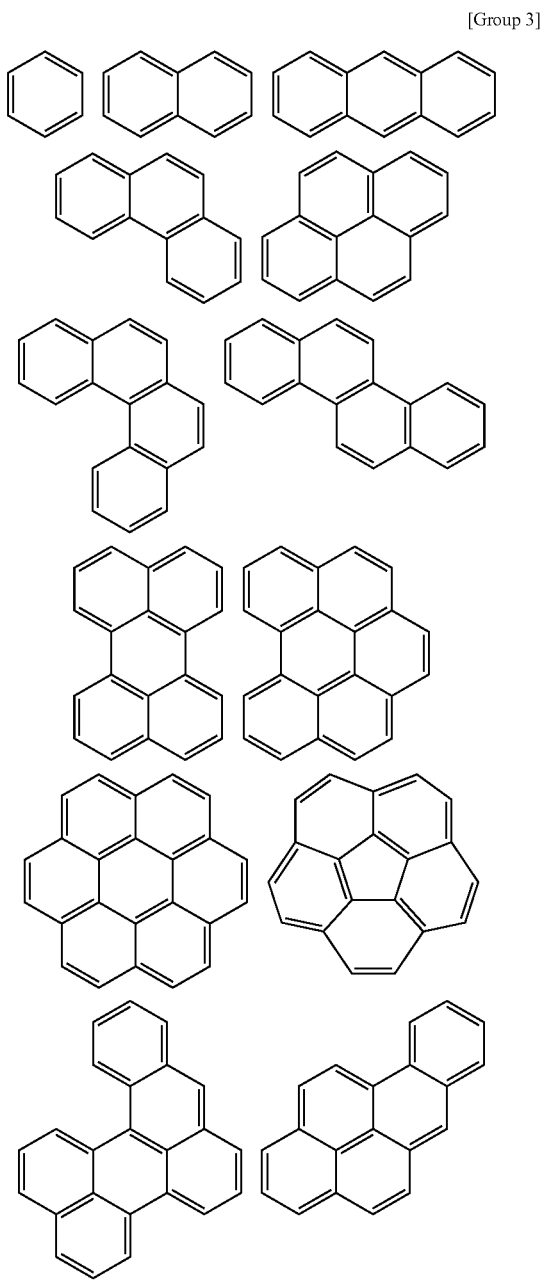

-continued

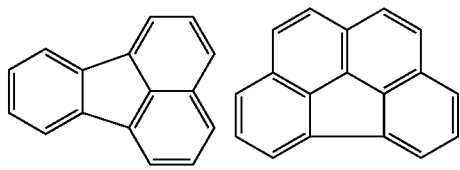

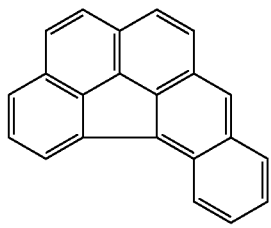

wherein in Group 3, a location of linking points is not limited.

4. The polymer as claimed in claim 1, wherein the structural unit represented by Chemical Formula 1 includes one of structural units represented by Chemical Formulae 1-1 to 1-8:

[Chemical Formula 1-1]

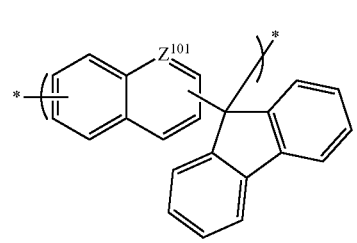

[Chemical Formula 1-2]

[Chemical Formula 1-3]

[Chemical Formula 1-4]

-continued

[Chemical Formula 1-5]

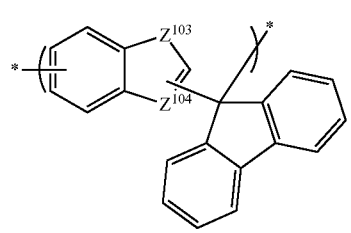

[Chemical Formula 1-6]

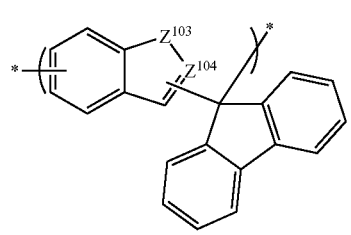

[Chemical Formula 1-7]

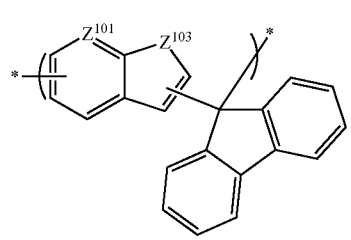

[Chemical Formula 1-8]

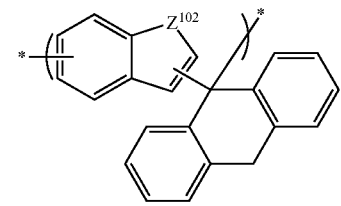

wherein, in Chemical Formulae 1-1 to 1-8,
$Z^{101}$ and $Z^{104}$ are N,
$Z^{102}$ is O, S, Te, or Se,
$Z^{103}$ is $NR^a$, O, S, Te, or Se,
$R^a$ and $R^{101}$ are hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, or a combination thereof, and
* is a linking point.

5. The polymer as claimed in claim 1, wherein the polymer has a weight average molecular weight of about 500 to about 20,000.

6. An organic layer composition, comprising
a polymer including a structural unit represented by Chemical Formula 1 and
a solvent:

[Chemical Formula 1]

wherein, in Chemical Formula 1,
A is a substituted or unsubstituted cyclic group selected from Group 2:

[Group 2]

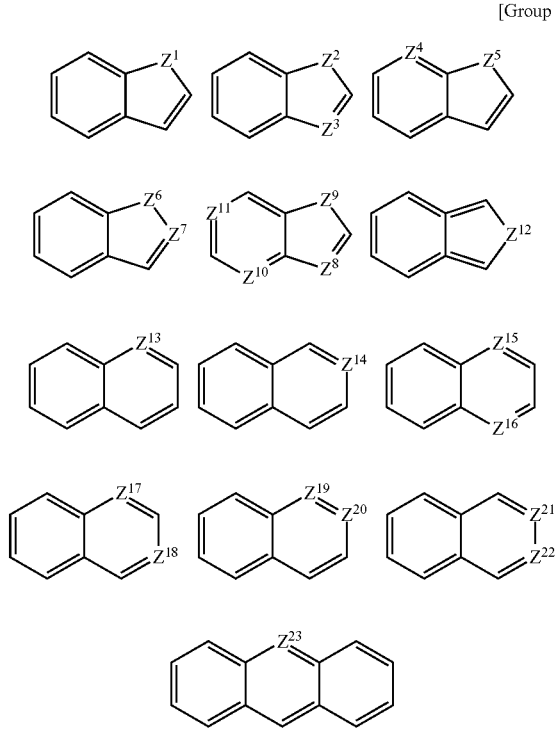

wherein, in Group 2, $Z^1$ and $Z^{12}$ are O, S, Te, or Se, $Z^2$, $Z^5$, $Z^6$, and $Z^9$ are $NR^a$, O, S, Te, or Se, $Z^3$ to $Z^4$, $Z^7$ to $Z^8$, $Z^{10}$ to $Z^{11}$ and $Z^{13}$ to $Z^{23}$ are N, and $R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom or a combination thereof, wherein in Group 2, a location of linking points is not limited, B is one of groups in Group 1, and

* is a linking point,

[Group 1]

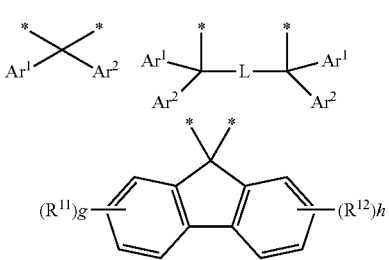

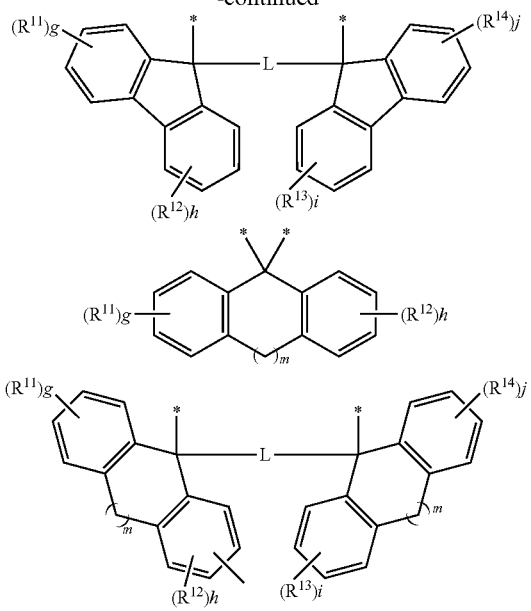

wherein, in Group 1, $Ar^1$ to $Ar^4$ are each independently a substituted or unsubstituted C6 to C30 aryl group, $R^{11}$ to $R^{14}$ are each independently a hydroxy group, a thionyl group, a thiol group, a cyano group, a substituted or unsubstituted amino group, a halogen atom, a substituted or unsubstituted C1 to C30 alkyl group, a substituted or unsubstituted C6 to C30 aryl group, a substituted or unsubstituted C1 to C30 alkoxy group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkylether group, a substituted or unsubstituted C7 to C20 arylalkylene ether group, a substituted or unsubstituted C1 to C30 haloalkyl group, or a combination thereof, g to j are each independently an integer ranging from 0 to 2, L is a single bond, a substituted or unsubstituted C1 to C6 alkylene group, a substituted or unsubstituted C6 to C30 arylene group, or a combination thereof, m is an integer ranging from 1 to 3, and

* is a linking point.

7. The organic layer composition as claimed in claim 6, wherein the hetero atom is N, O, S, Te, or Se.

8. The organic layer composition as claimed in claim 6, wherein:

B in Chemical Formula 1 is selected from

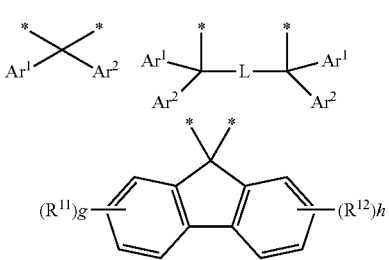

in Group 1, and $Ar^1$ to $Ar^4$ are each independently a substituted or unsubstituted cyclic group selected from Group 3:

[Group 3]
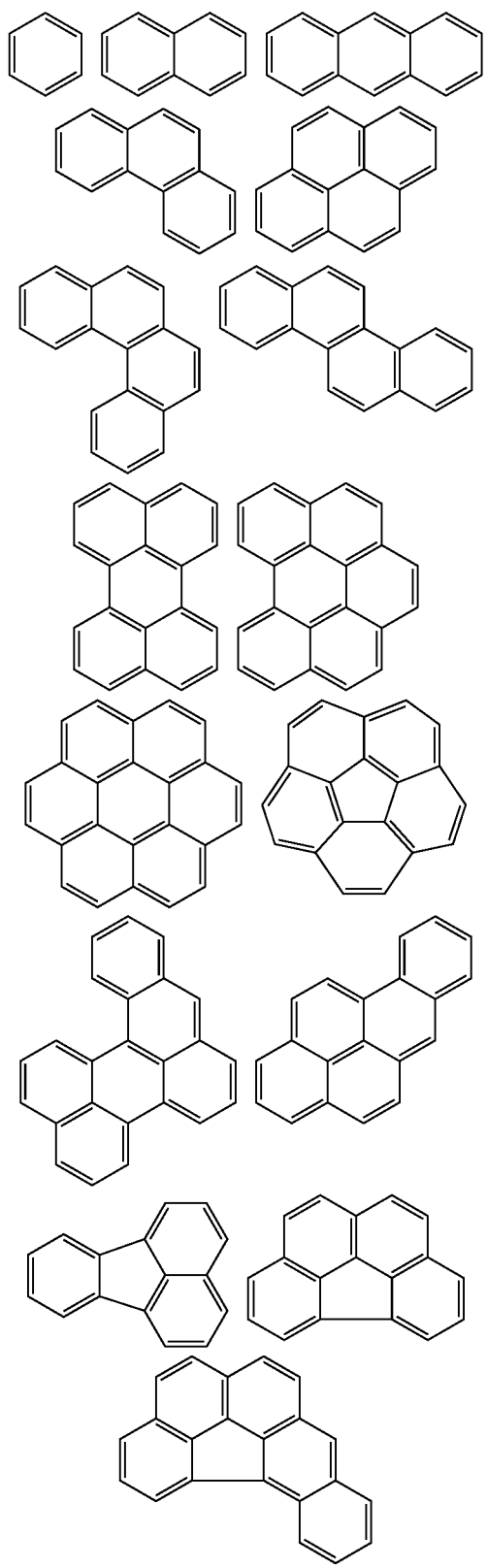
wherein, in Group 3, a location of linking points is not limited.
9. The organic layer composition as claimed in claim 6, wherein the structural unit represented by Chemical Formula 1 includes one of structural units represented by Chemical Formulae 1-1 to 1-8:
[Chemical Formula 1-1]
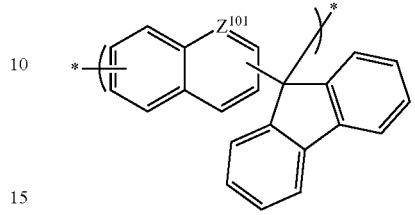
[Chemical Formula 1-2]
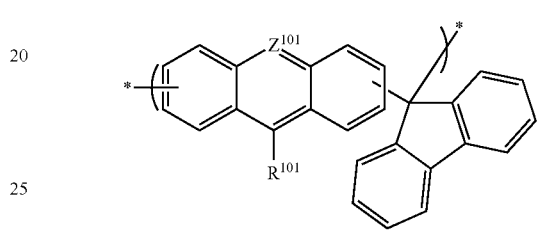
[Chemical Formula 1-3]
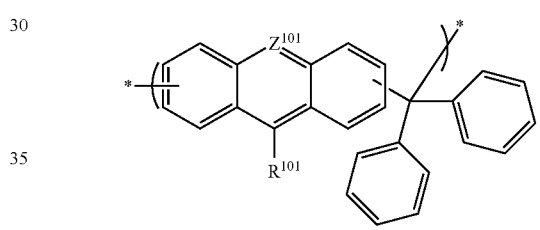
[Chemical Formula 1-4]
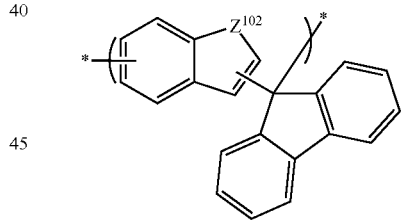
[Chemical Formula 1-5]
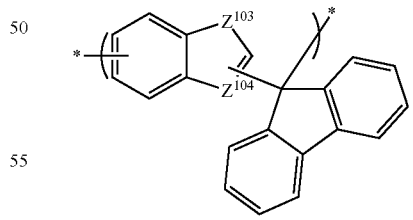
[Chemical Formula 1-6]
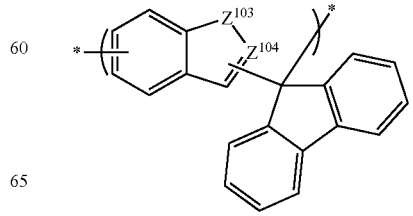

-continued

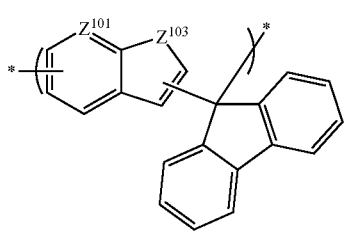
[Chemical Formula 1-7]

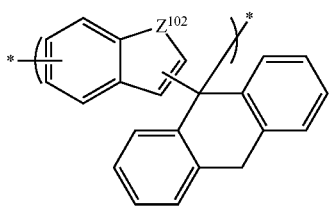
[Chemical Formula 1-8]

wherein, in Chemical Formulae 1-1 to 1-8,
$Z^{101}$ and $Z^{104}$ are N,
$Z^{102}$ is O, S, Te, or Se,
$Z^{103}$ is $NR^a$, O, S, Te, or Se,
$R^a$ and $R^{101}$ are hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, or a combination thereof, and
* is a linking point.

10. The organic layer composition as claimed in claim 6, wherein the polymer has a weight average molecular weight of about 500 to about 20,000.

11. The organic layer composition as claimed in claim 6, wherein the polymer is included in an amount of about 0.1 wt % to about 50 wt % based on the total amount of the organic layer composition.

12. A method of forming patterns, the method comprising providing a material layer on a substrate,
applying the organic layer composition as claimed in claim 6 on the material layer,
heat-treating the organic layer composition to form a hardmask layer,
forming a silicon-containing thin layer on the hardmask layer,
forming a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer.

13. The method as claimed in claim 12, wherein the organic layer composition is applied using a spin-on coating method.

14. The method as claimed in claim 12, which further comprises forming a bottom antireflective coating (BARC) before forming the photoresist layer.

15. The method as claimed in claim 12, wherein the heat-treating is performed at about 100° C. to about 500° C.

* * * * *